(12) United States Patent
Kim et al.

(10) Patent No.: US 10,388,582 B2
(45) Date of Patent: *Aug. 20, 2019

(54) SEMICONDUCTOR DEVICE AND MANUFACTURING METHOD THEREOF

(71) Applicant: Amkor Technology, Inc., Tempe, AZ (US)

(72) Inventors: Young Rae Kim, Gwangju-si (KR); Won Chul Do, Bucheon-si (KR); Ji Hun Lee, Seoul (KR); Min Hwa Chang, Seoul (KR); Dong Hyun Kim, Jeju-si (KR); Wang Gu Lee, Goyang-si (KR); Jin Ryang Hwang, Gwangju-si (KR); Mi Kyeong Choi, Seoul (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/945,938

(22) Filed: Apr. 5, 2018

(65) Prior Publication Data

US 2018/0226312 A1    Aug. 9, 2018

Related U.S. Application Data

(63) Continuation of application No. 15/148,824, filed on May 6, 2016, now Pat. No. 9,941,180.

(30) Foreign Application Priority Data

Oct. 22, 2015   (KR) .................. 10-2015-0147395

(51) Int. Cl.
 *H01L 21/78*   (2006.01)
 *H01L 23/18*   (2006.01)
(Continued)

(52) U.S. Cl.
 CPC ............ *H01L 23/18* (2013.01); *H01L 21/485* (2013.01); *H01L 21/486* (2013.01);
(Continued)

(58) Field of Classification Search
 None
 See application file for complete search history.

(56) References Cited

U.S. PATENT DOCUMENTS 6,414,381 B1 *  7/2002  Takeda ................ H01L 23/16
                                                 257/676
6,782,610 B1 *  8/2004  Iijima ................. H01L 21/6835
                                                 205/125
(Continued)

FOREIGN PATENT DOCUMENTS

KR   10-2008-0058984    6/2008
KR   10-2008-0074468    8/2008
KR      10-1419597      7/2014

OTHER PUBLICATIONS

Korean Office Action for application No. 10-2015-0147395 dated Nov. 29, 2016 (8 pages).

*Primary Examiner* — Michael Lebentritt
(74) *Attorney, Agent, or Firm* — McAndrews, Held & Malloy, Ltd.

(57) ABSTRACT

A semiconductor package and a manufacturing method thereof, which can reduce the size of the semiconductor package and improve product reliability. In a non-limiting example embodiment, the method may comprise forming an interposer on a wafer, forming at least one reinforcement member on the interposer, coupling and electrically connecting at least one semiconductor die to the interposer to the interposer, filling a region between the semiconductor die and the interposer with an underfill, and encapsulating
(Continued)

the reinforcement member, the semiconductor die and the underfill on the interposer using an encapsulant.

20 Claims, 9 Drawing Sheets

(51) Int. Cl.
*H01L 21/48* (2006.01)
*H01L 21/56* (2006.01)
*H01L 23/31* (2006.01)
*H01L 23/538* (2006.01)
*H01L 23/16* (2006.01)
*H01L 23/552* (2006.01)
*H01L 23/00* (2006.01)
*H01L 25/065* (2006.01)
*H01L 25/10* (2006.01)
*H01L 25/00* (2006.01)
*H01L 23/498* (2006.01)

(52) U.S. Cl.
CPC ...... *H01L 21/4853* (2013.01); *H01L 21/4857* (2013.01); *H01L 21/561* (2013.01); *H01L 21/563* (2013.01); *H01L 21/78* (2013.01); *H01L 23/16* (2013.01); *H01L 23/3128* (2013.01); *H01L 23/3185* (2013.01); *H01L 23/5382* (2013.01); *H01L 23/5384* (2013.01); *H01L 23/5386* (2013.01); *H01L 23/552* (2013.01); *H01L 23/562* (2013.01); *H01L 24/97* (2013.01); *H01L 21/568* (2013.01); *H01L 23/49816* (2013.01); *H01L 23/5383* (2013.01); *H01L 23/5389* (2013.01); *H01L 24/13* (2013.01); *H01L 24/16* (2013.01); *H01L 24/81* (2013.01); *H01L 24/83* (2013.01); *H01L 24/92* (2013.01); *H01L 25/0655* (2013.01); *H01L 25/105* (2013.01); *H01L 25/50* (2013.01); *H01L 2224/13116* (2013.01); *H01L 2224/16238* (2013.01); *H01L 2224/26175* (2013.01); *H01L 2224/32225* (2013.01); *H01L 2224/73204* (2013.01); *H01L 2224/81005* (2013.01); *H01L 2224/81203* (2013.01); *H01L 2224/81423* (2013.01); *H01L 2224/81439* (2013.01); *H01L 2224/81444* (2013.01); *H01L 2224/81447* (2013.01); *H01L 2224/81464* (2013.01); *H01L 2224/81815* (2013.01); *H01L 2224/83005* (2013.01); *H01L 2224/92125* (2013.01); *H01L 2224/97* (2013.01); *H01L 2225/1023* (2013.01); *H01L 2225/1058* (2013.01); *H01L 2225/1094* (2013.01); *H01L 2924/15311* (2013.01); *H01L 2924/3025* (2013.01); *H01L 2924/3511* (2013.01)

(56) References Cited

U.S. PATENT DOCUMENTS

| | | | |
|---|---|---|---|
| 7,279,366 B2 | 10/2007 | Bolken | |
| 7,786,747 B2* | 8/2010 | Shih | G02F 1/136 |
| | | | 324/754.03 |
| 7,847,382 B2* | 12/2010 | Pagaila | H01L 21/568 |
| | | | 257/684 |
| 7,960,827 B1* | 6/2011 | Miller, Jr. | H01L 23/3677 |
| | | | 257/712 |
| 7,989,942 B2* | 8/2011 | Toong | H01L 23/367 |
| | | | 257/686 |
| 8,378,477 B2* | 2/2013 | Do | H01L 21/566 |
| | | | 257/685 |
| 8,409,917 B2* | 4/2013 | Yoon | H01L 21/563 |
| | | | 438/106 |
| 8,409,923 B2* | 4/2013 | Kim | H01L 23/13 |
| | | | 257/685 |
| 8,624,364 B2* | 1/2014 | Chow | H01L 21/563 |
| | | | 257/667 |
| 8,765,525 B2* | 7/2014 | Yoon | H01L 23/13 |
| | | | 438/106 |
| 9,236,319 B2* | 1/2016 | Ha | H01L 23/3128 |
| 9,287,194 B2* | 3/2016 | Hung | H01L 23/48 |
| 9,355,869 B2* | 5/2016 | Sugiyama | H01L 24/14 |
| 9,941,180 B2* | 4/2018 | Kim | H01L 21/561 |
| 2004/0245556 A1* | 12/2004 | Farooq | H01L 23/49822 |
| | | | 257/296 |
| 2005/0047106 A1* | 3/2005 | Martino | H01L 23/04 |
| | | | 361/803 |
| 2005/0255637 A1* | 11/2005 | Bolken | H01L 21/563 |
| | | | 438/127 |
| 2011/0031610 A1* | 2/2011 | Yamazaki | H01L 23/4985 |
| | | | 257/693 |
| 2014/0124949 A1 | 5/2014 | Paek et al. | |
| 2015/0228550 A1* | 8/2015 | Yu | H01L 25/0652 |
| | | | 257/48 |

* cited by examiner

SEMICONDUCTOR DEVICE AND MANUFACTURING METHOD THEREOF

CROSS-REFERENCE TO RELATED APPLICATIONS/INCORPORATION BY REFERENCE

The present application is a continuation of U.S. application Ser. No. 15/148,824 titled "Semiconductor Device and Manufacturing Method Thereof" and filed on May 6, 2016, (now Pat. No. 9,941,180), which in turn claims priority to and claims the benefit of Korean Patent Application No. 10-2015-0019458 filed on Feb. 9, 2015. The contents of each of the above applications are hereby incorporated herein by reference in their entirety.

BACKGROUND

Present semiconductor packages and methods for forming sensor devices (e.g., fingerprint sensor devices) are inadequate, for example resulting in inadequate sensing accuracy and/or device reliability, manufacturability issues, devices that are thicker than necessary, devices that are difficult and/or costly to incorporate into other products, etc. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
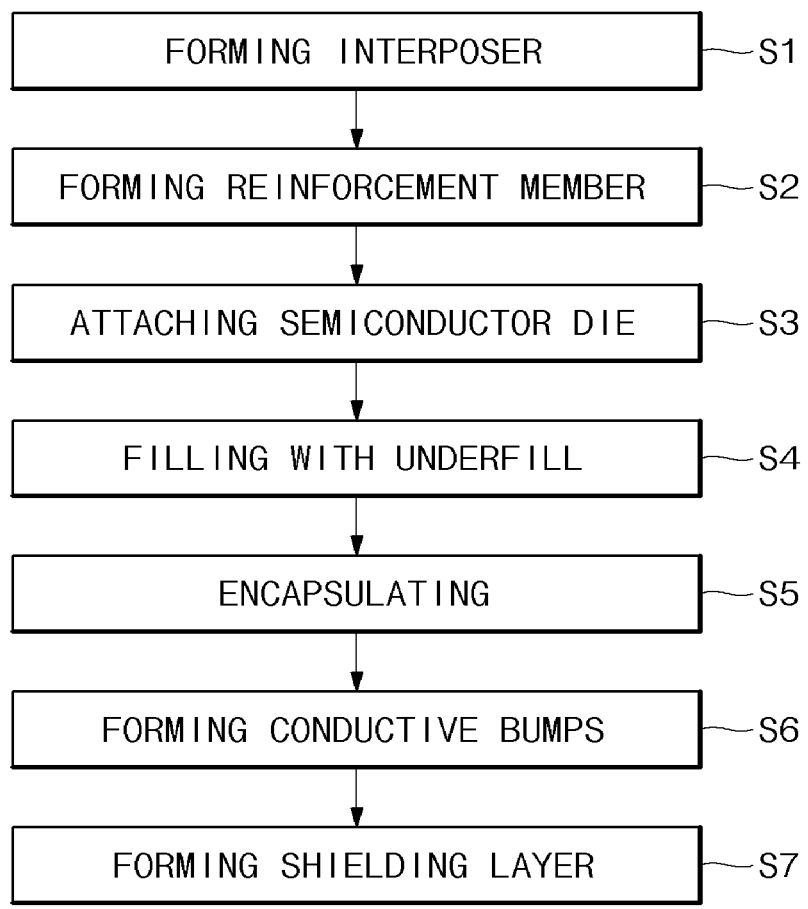
FIG. 1 is a flowchart illustrating a method for fabricating a semiconductor package according to an embodiment of the present disclosure.

Various aspects of this disclosure provide a semiconductor package and a manufacturing method thereof, which can reduce the size of the semiconductor package and can improve product reliability. In a non-limiting example embodiment, the method may comprise forming an interposer on a wafer, forming at least one reinforcement member on the interposer, coupling and electrically connecting at least one semiconductor die to the interposer to the interposer, filling a region between the semiconductor die and the interposer with an underfill, and encapsulating the reinforcement member, the semiconductor die and the underfill on the interposer using an encapsulant.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion.

Further, it should be understood that when an element A is referred to as being "connected to" or "coupled to" an element B, the element A can be directly connected to the element B or indirectly connected to the element B (e.g., an intervening element C (and/or other elements) may be positioned between the element A and the element B).

Certain embodiments of the disclosure relate to a method for fabricating a semiconductor package and a semiconductor package using the same.

Recently, mobile communication terminals, such as cellular phones or smart phones, or small-sized electronic devices, such as tablet PCs, MP3 players or digital cameras, have been developed to be smaller in size and lighter in weight. Along with this trend, semiconductor packages constituting small-sized electronic devices are becoming smaller and lighter.

To accommodate various kinds of semiconductor dies and to obtain high-density redistribution layers (or structures), a semiconductor package employs an interposer (or substrate). Since the interposer generally includes a through silicon via (TSV) passing through a silicon substrate, the fabricating process may become complicated and the fabricating cost may be increased. In addition, a warpage phenomenon may occur due to differences in thermal expansion coefficients between the interposer and the semiconductor die and between the interposer and an encapsulant.

The present disclosure provides a method for fabricating a semiconductor package and the semiconductor package using the same, which can reduce the size of the semiconductor package and can improve product reliability.

The above and other objects of the present disclosure will be described in or be apparent from the following description of the preferred embodiments.

According to an aspect of the present disclosure, there is provided a method for fabricating a semiconductor package, the method including forming an interposer on a wafer, forming at least one reinforcement member on the interposer, attaching at least one semiconductor die onto the interposer die to be electrically connected to the interposer, filling a region between the semiconductor die and the interposer with an underfill, and encapsulating the reinforcement member, the semiconductor die and the underfill on the interposer using an encapsulant.

According to an aspect of the present disclosure, there is provided a semiconductor package including an interposer, at least one reinforcement member formed on the interposer, at least one semiconductor die formed on the interposer to be electrically connected to the interposer, an underfill filling a region between the semiconductor die and the interposer, and an encapsulant encapsulating the reinforcement member, the semiconductor die and the underfill on the interposer.

As described above, in the method for fabricating a semiconductor package and the semiconductor package using the same according to the present disclosure, since the reinforcement member may be formed on the interposer to prevent the underfill which filling a region between the interposer and the semiconductor die from flowing side of the interposer, thereby reducing the size of the semiconductor package and improving product reliability.

In addition, in the method for fabricating a semiconductor package and the semiconductor package using the same according to the present disclosure, since the reinforcement member and the underfill are formed on the interposer, it is possible to suppress a warpage phenomenon occurring due to differences in thermal expansion coefficients between the interposer and the semiconductor die and between the interposer and an encapsulant.

Reference will now be made in detail to the present embodiments of the present disclosure, examples of which are illustrated in the accompanying drawings.

Various aspects of the present disclosure may be embodied in many different forms and should not be construed as being limited to the example embodiments set forth herein. Rather, these example embodiments of the disclosure are provided so that this disclosure will be thorough and complete and will convey various aspects of the disclosure to those skilled in the art.

In the drawings, the thickness of layers and regions are exaggerated for clarity. Here, like reference numerals refer to like elements throughout. As used herein, the term "and/or" includes any and all combinations of one or more of the associated listed items.

In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises" and/or "comprising," when used in this specification, specify the presence of stated features, numbers, steps, operations, elements, and/or components, but do not preclude the presence or addition of one or more other features, numbers, steps, operations, elements, components, and/or groups thereof.

FIG. 1 is a flowchart illustrating a method for fabricating a semiconductor package according to an embodiment of the present disclosure and FIGS. 2A to 2K are cross-sectional views illustrating the method for fabricating a semiconductor package shown in FIG. 1.

As illustrated in FIG. 1, the method for fabricating a semiconductor package according to an embodiment of the present disclosure includes the steps of: forming an interposer (S1), forming a reinforcement member (S2), attaching a semiconductor die (S3), filling with an underfill (S4), encapsulating (S5), forming conductive bumps (S6), and forming a shielding layer (S7). Various steps of FIG. 1 will now be described in detail with reference to FIGS. 2A to 2K.

Figure 2A:
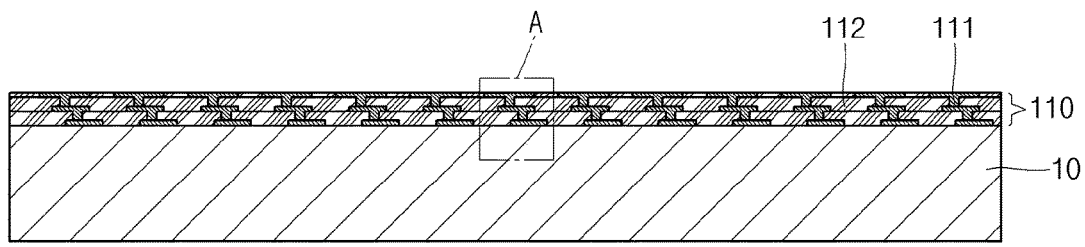
FIGS. 2A to 2K are cross-sectional views illustrating the method for fabricating a semiconductor package shown in FIG. 1.
Figure 2B:
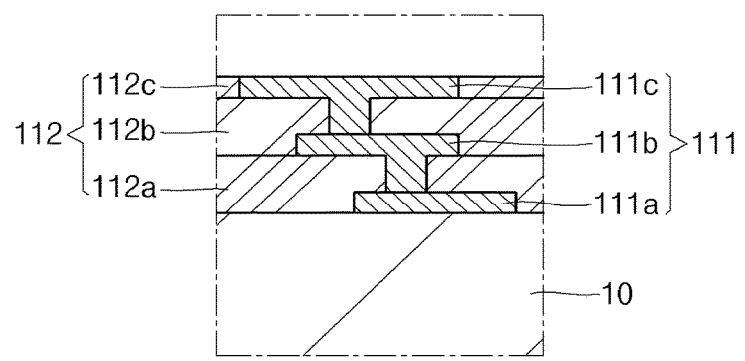
Figure 2C:
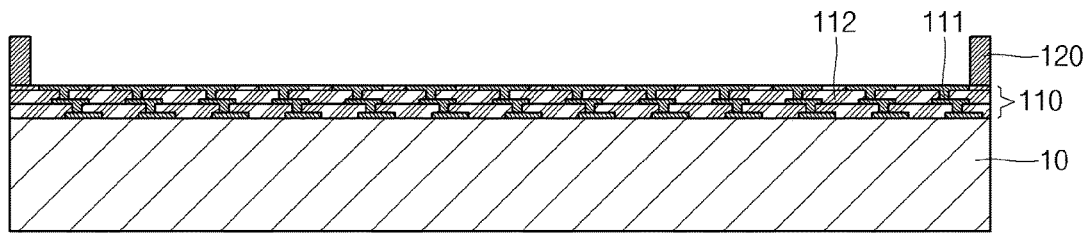

In the forming of the interposer (S1), the interposer 110 is formed on a wafer 10. As illustrated in FIG. 2A, the interposer 110 includes a multi-layered redistribution layer 111 (or redistribution structure) and a passivation layer 112 covering the redistribution layer 111. In detail, as illustrated in FIG. 2B, which is an enlarged view of a portion A of FIG. 2A, in the forming of the interposer (S1), a first redistribution layer 111a (or conductive layer) is formed on the wafer 10 and a portion of the first redistribution layer 111a is covered by the first passivation layer 112a (or dielectric layer). Then, a second redistribution layer 111b (or conductive layer) electrically connected to the first redistribution layer 111a is further formed and a portion of the second redistribution layer 111b is covered by the second passivation layer 112b (or dielectric layer). In addition, a third redistribution layer 111c (or conductive layer) electrically connected to the second redistribution layer 111b is further formed and a portion of the third redistribution layer 111c is covered by the third passivation layer 112c (or dielectric layer), thereby completing the example interposer 110. Here, the third redistribution layer 111c is exposed to a top surface of the interposer 110. While the redistribution layer 111 having three layers is illustrated in FIGS. 2A to 2C, the number of layers of the redistribution layer 111 may be more than or fewer than three. In addition, the wafer 10 may be made of silicon (Si), glass or a metal, but aspects of the present disclosure are not limited thereto.

The redistribution layer 111 (or conductive layers thereof) may be made of one selected from the group consisting of copper, aluminum, gold, silver, palladium, and equivalents thereof, by electroless plating, electroplating, and/or sputtering, but aspects of the present disclosure are not limited thereto. In addition, patterning or routing of the redistribution layer 111 (or conductive layers thereof) may be performed by photolithography using a general photoresist, but aspects of the present disclosure are not limited thereto.

The passivation layer 112 (or dielectric layer(s)) may be made of one selected from the group consisting of a polymer, such as polyimide, benzocyclobutene or polybenzoxazole, and equivalents thereof, but aspects of the present disclosure are not limited thereto. In addition, the passivation layer 112 may be formed by one method selected from the group consisting of spin coating, spray coating, dip coating, rod coating, and equivalents thereof, but aspects of the present disclosure are not limited thereto.

In addition, the interposer 110 may be completed by supplying a portion of the redistribution layer 111 formed on the wafer 10 during a fabricating process (or factory) of the wafer 10 and additionally forming the redistribution layer 111 thereon during a packaging process (or factory). Therefore, since the interposer 110 enables finer linewidth (less than 100 µm) and finer pitch interconnection, high-density interconnection can be achieved. The interposer 110 of this type may, for example, be referred to as a silicon-less integrated module (SLIM) interposer. Additionally, the interposer 110 may be fabricated by supplying only the wafer 10 during a fabricating process (or factory) of the wafer 10 and forming the redistribution layer 111 (or redistribution structure) on the wafer 10 during a packaging process (or factory). The interposer 110 of this type may, for example, be referred to as a silicon wafer integrated fan-out technology (SWIFT) interposer. Also for example, the interposer 110 may be a printed circuit board (PCB).

In the forming of the reinforcement member (S2), the reinforcement member 120 is formed on the interposer 110. As illustrated in FIG. 2C, the reinforcement member 120 is shaped of a pillar or wall disposed to be substantially perpendicular to the interposer 110 and is formed at edges of the interposer 110. The reinforcement member 120 may be made of a conductive material having high electrical and thermal conductivity (e.g., one selected from copper (Cu) or an equivalent thereof), or a plastic material having high thermal conductivity, but aspects of the present disclosure are not limited thereto.

Figure 2D:
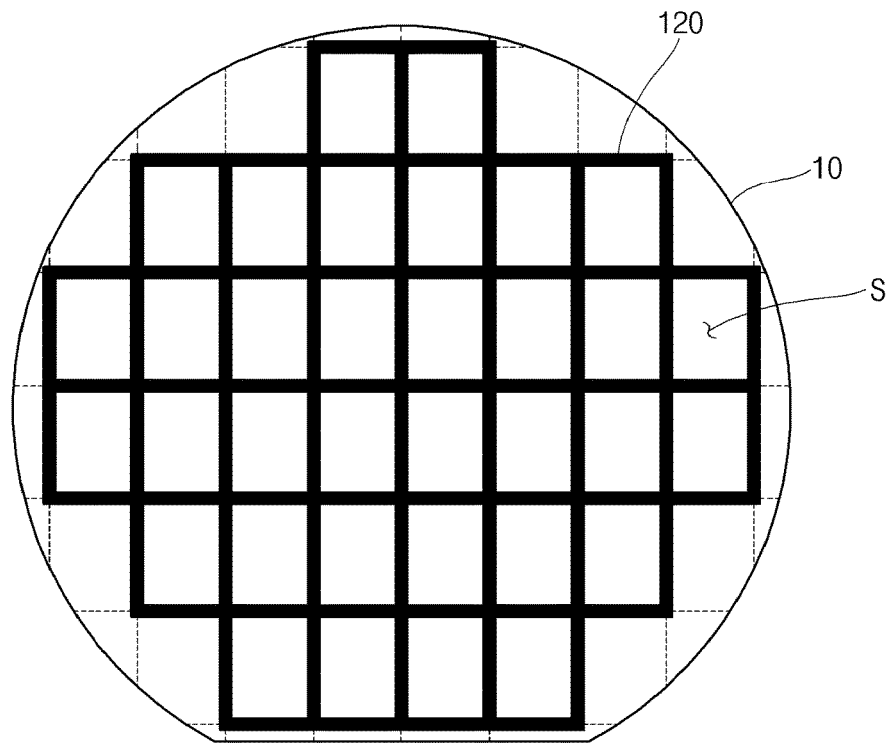

As illustrated in FIG. 2D, the reinforcement member 120 may be formed on the wafer 10 in a matrix configuration during a process using the wafer 10. In particular, the reinforcement member 120 is formed on sawing lines for sawing the wafer 10 to form a discrete semiconductor package. Therefore, the example reinforcement member 120 is formed to entirely surround edges of the interposer 110, thereby forming a receiving space S (or die space or component space) in which a semiconductor die 130 to be described later is to be mounted.

Figure 2E:
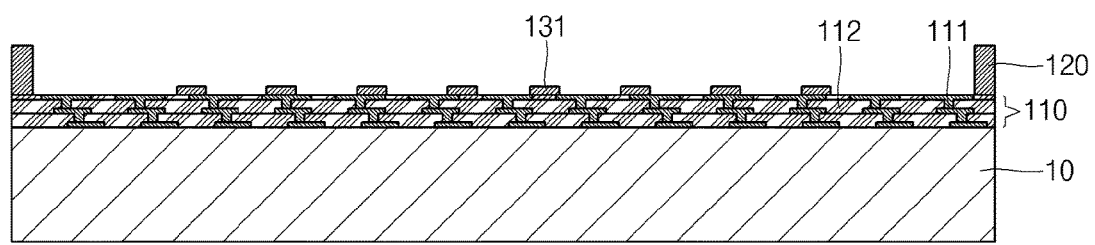

In the attaching of the semiconductor die (S3), the semiconductor die 130 is attached onto the interposer 110. First, as illustrated in FIG. 2E, in the attaching of the semiconductor die (S3), a conductive pad 131 is formed on the redistribution layer 111 exposed to the top surface of the interposer 110. Therefore, the conductive pad 131 is electrically connected to the redistribution layer 111 (or redistribution structure). In addition, the conductive pad 131 may be formed in advance in the forming of the interposer (S1) or may be formed together with the reinforcement member 120 in the forming of the reinforcement member (S2). The conductive pad 131 may be made of one selected from the group consisting of copper, aluminum, gold, silver, palladium, and equivalents thereof, but aspects of the present disclosure are not limited thereto. In addition, the conductive pad 131 may be formed by sputtering, vacuum deposition or photolithography, but aspects of the present disclosure are not limited thereto.

Figure 2F:
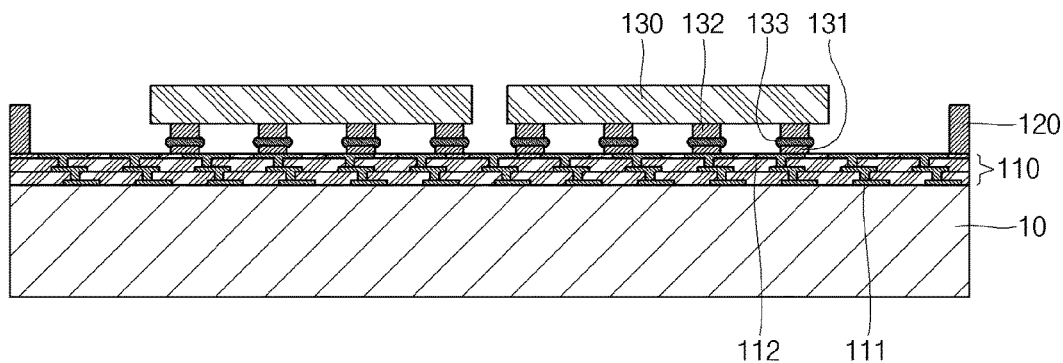

Next, as illustrated in FIG. 2F, in the attaching of the semiconductor die (S3), the semiconductor die 130 is electrically connected to the conductive pad 131. For example, conductive bumps 132 of the semiconductor die 130 are electrically connected to the conductive pad 131 through solders 133. For example, the semiconductor die 130 may be electrically connected to the conductive pad 131 using a mass reflow process, a thermal compression process or a laser bonding process. The solders 133 may be formed using one selected from a metallic material, such as lead/tin (Pb/Sn) or leadless Sn, and equivalents thereof, but aspects of the present disclosure are not limited thereto.

In addition, the semiconductor die 130 may include, for example, an electrical circuit, such as a digital signal processor(DSP), a microprocessor, a network processor, a power management processor, an audio processor, an RF circuit, a wireless baseband system-on-chip (SoC) processor, a sensor, or an application specific integrated circuit (ASIC).

Figure 2G:
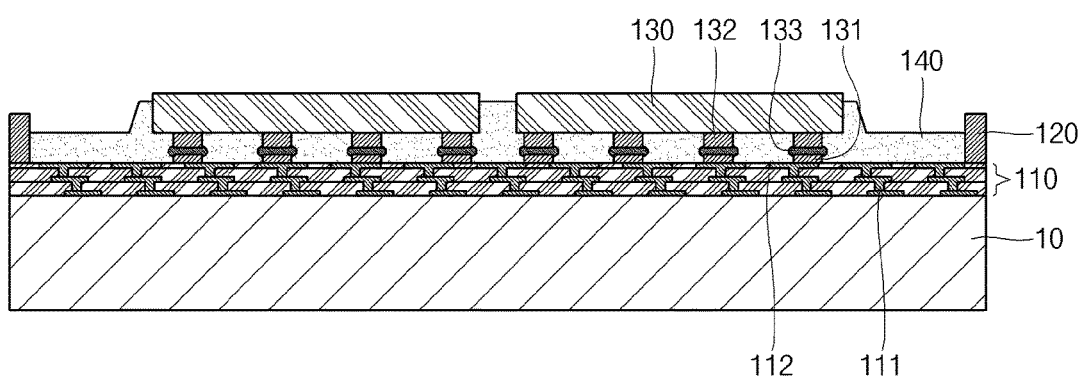

In the filling with the underfill (S4), the underfill 140 fills a region between the interposer 110 and the semiconductor die 130. As illustrated in FIG. 2G, the underfill 140 fills the region between a top surface of the interposer 110 and a bottom surface of the semiconductor die 130, followed by curing. The underfill 140 protects bump bonding portions from external factors, such as mechanical shock or corrosion, during the semiconductor package fabricating process. Here, the underfill 140 may be made of one selected from the group consisting of epoxy, a thermoplastic material, a thermal curable material, polyimide, polyurethane, a polymeric material, filled epoxy, a filled thermoplastic material, a filled thermal curable material, filled polyimide, filled polyurethane, a filled polymeric material, fluxed underfill, and equivalents thereof, but aspects of the present disclosure are not limited thereto.

In addition, the underfill 140 entirely covers the top surface of the interposer 110 and is provided so as to be brought into contact with one lateral surface of the reinforcement member 120. Accordingly, the underfill 140 may not flow to the sides of the interposer 110 by means of the reinforcement member 120. That is to say, the reinforcement member 120 may serve as a barrier for preventing the underfill 140 from flowing in the filling with the underfill 140.

In addition, since the underfill 140 is formed between the interposer 110 and the semiconductor die 130 while entirely covering the top surface of the interposer 110, it is possible to suppress a warpage phenomenon occurring due to differences in thermal expansion coefficients between the interposer 110 and the semiconductor die 130 and between the interposer 110 and an encapsulant 150.

Figure 2H:
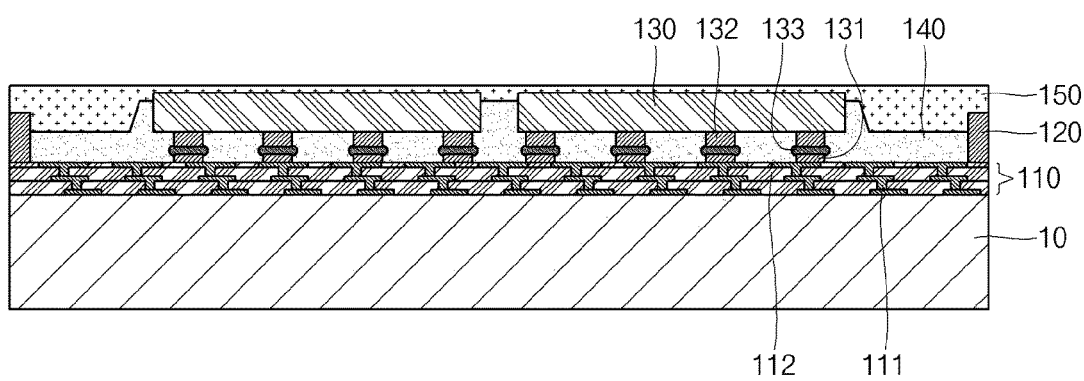

In the encapsulating (S5), a top portion of the interposer 110 is encapsulated using the encapsulant 150. As illustrated in FIG. 2H, in the encapsulating (S5), the reinforcement member 120, the semiconductor die 130 and the underfill 140 mounted on the interposer 110 are encapsulated using the encapsulant 150. The encapsulant 150 completely encapsulates the reinforcement member 120, the semiconductor die 130 and the underfill 140, thereby protecting the reinforcement member 120, the semiconductor die 130 and the underfill 140 from being damaged due to external shocks and oxidation. The encapsulant 150 may be made of one selected from the group consisting of a thermally curable epoxy molding compound for general transfer molding, a room-temperature curable glop top for dispensing, and equivalent thereof, but aspects of the present disclosure are not limited thereto. Here, the encapsulant 150 is spaced apart from the top surface of the interposer 110 without being brought into direct contact with the top surface of the interposer 110.

Although not shown, unnecessary portions of a top surface of the encapsulant 150 may be removed by grinding by a predetermined thickness. Here, the grinding may be performed by, for example, a diamond grinder or an equivalent thereof, but aspects of the present disclosure are not limited thereto.

Figure 2I:
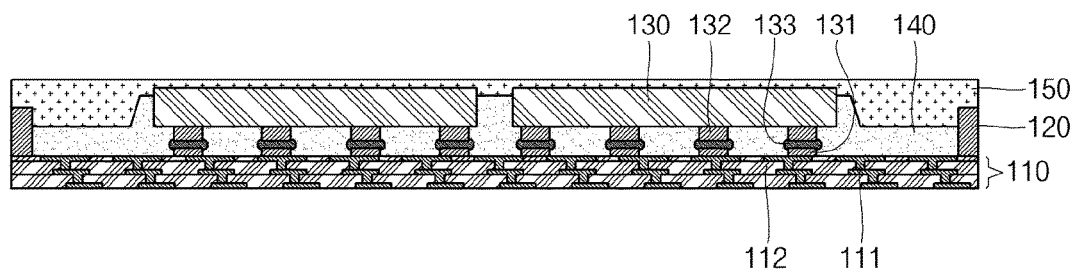
Figure 2J:
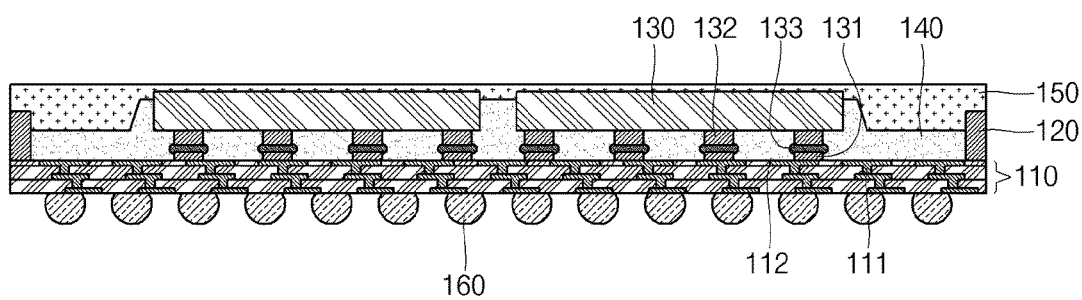

In the forming of the conductive bumps (S6), the wafer 10 positioned under the interposer 110 is removed and the conductive bumps 160 are formed under the interposer 110. First, as illustrated in FIG. 2I, in the forming of the conductive bumps (S6), the wafer 10 positioned under the interposer 110 is removed. For example, the wafer 10 may be removed by a general grinding process. Accordingly, the redistribution layer 111 (e.g., a first redistribution layer or conductive layer) is exposed to a bottom surface of the interposer 110. Next, as illustrated in FIG. 2J, in the forming of the conductive bumps (S6), the conductive bumps 160 are formed on the redistribution layer 111 exposed to the bottom surface of the interposer 110. Here, under bump metals (UBMs) may be formed on the redistribution layer 111 exposed to the bottom surface of the interposer 110 and the conductive bumps 160 may be formed on the UBMs. The UBMs may improve board-level reliability of the conductive bumps 160 by preventing inter-metal compounds from being formed between the conductive bumps 160 and the redistribution layer 111.

The conductive bumps 160 may be made of a material selected from, but not limited to, eutectic solders (e.g., Sn37Pb), high-lead solders (e.g., Sn95Pb) having a high melting point, lead-free solders (e.g., SnAg, SnCu, SnZn, SnZnBi, SnAgCu and SnAgBi) and equivalents thereof.

Next, although not shown, a sawing process is performed to form a single unit consisting of at least one semiconductor die 130 and the reinforcement member 120 corresponding thereto disposed in the receiving space S (or die space or component space), thereby fabricating the semiconductor package 100 according to an embodiment of the present disclosure. Here, the sawing process may be performed using sawing equipment (for example, a diamond blade or laser beams).

Figure 2K:
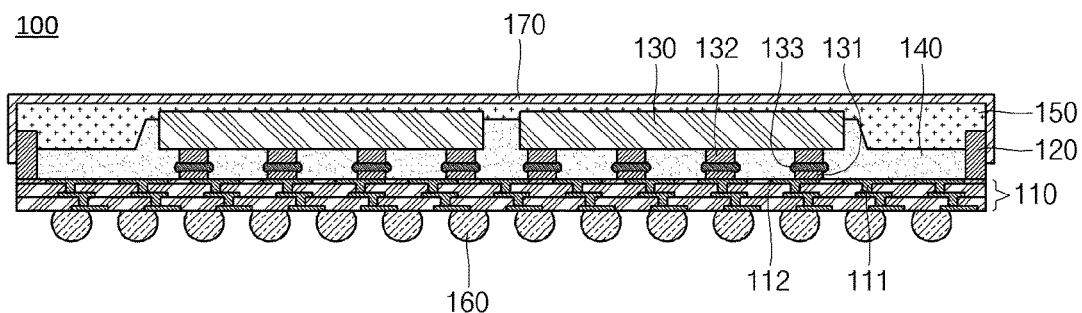

In the forming of the shielding layer (S7), a shielding layer 170 is formed on a surface of the encapsulant 150. In the forming of the shielding layer (S7), as illustrated in FIG. 2K, the shielding layer 170 is formed to cover the entire surface of the encapsulant 150 and at least a portion of the reinforcement member 120. For example, the shielding layer 170 may be formed by coating a conductive paste mixed with conductive metal powder on the surface of the encapsulant 150 by spraying or sputtering, but aspects of the present disclosure are not limited thereto.

Here, when the shielding layer 170 is formed, the reinforcement member 120 may be made of a conductive metal while one end thereof is preferably grounded. Therefore, electromagnetic waves generated from the at least one semiconductor die 130 in the encapsulant 150 may be shielded by the shielding layer 170 so as not to scatter to the outside, and externally applied electromagnetic waves may also be shielded by the shielding layer 170 so as not to penetrate into the at least one semiconductor die 130 in the encapsulant 150.

Figure 3:
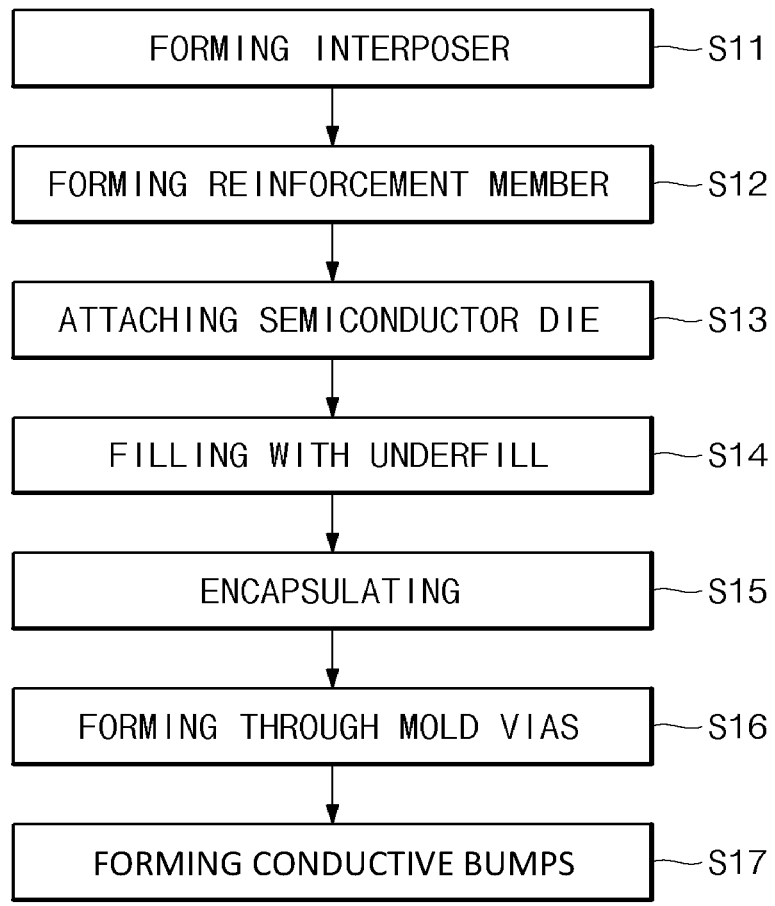
FIG. 3 is a flowchart illustrating a method for fabricating a semiconductor package according to another embodiment of the present disclosure.
Figure 4A:
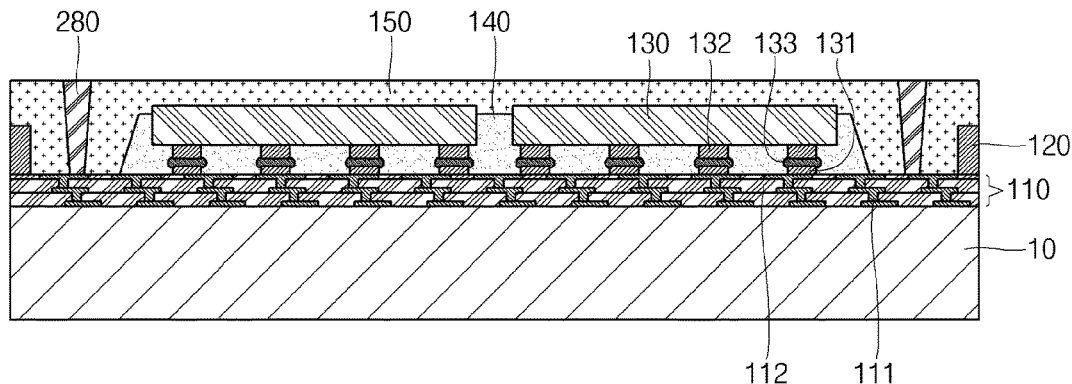
FIGS. 4A to 4C are cross-sectional views illustrating the method for fabricating a semiconductor package shown in FIG. 3.
Figure 4B:
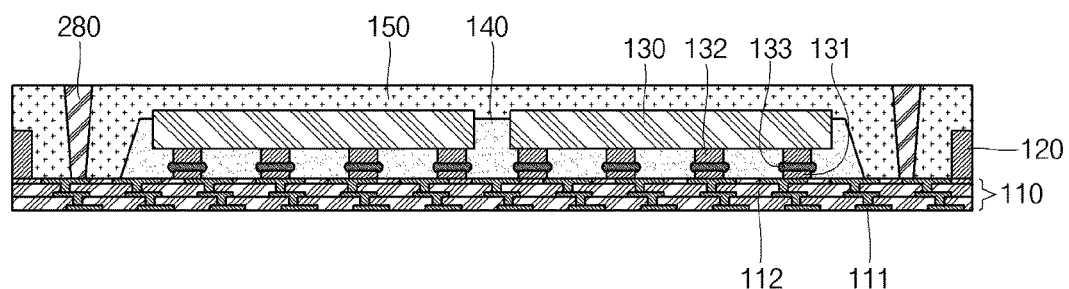
Figure 4C:
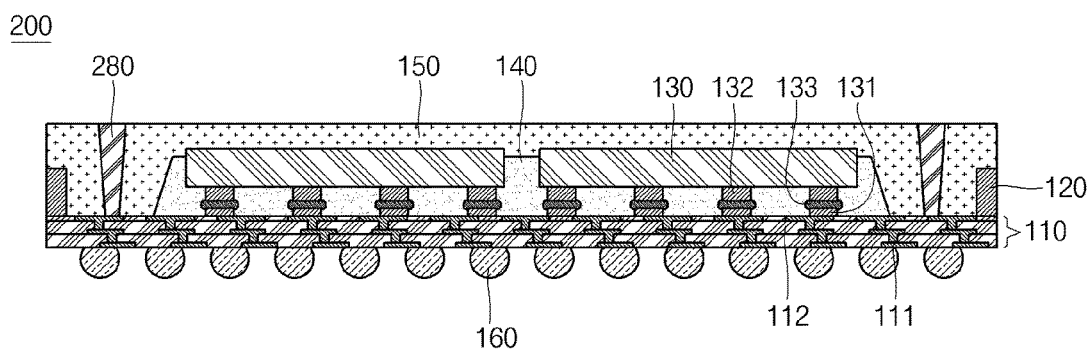

FIG. 3 is a flowchart illustrating a method for fabricating a semiconductor package according to another embodiment of the present disclosure and FIGS. 4A to 4C are cross-sectional views illustrating the method for fabricating a semiconductor package shown in FIG. 3.

Referring to FIG. 3, the method for fabricating a semiconductor package according to another embodiment of the present disclosure includes the steps of: forming an interposer (S11), forming a reinforcement member (S12), attaching a semiconductor die (S13), filling with an underfill (S14), encapsulating (S15), forming through mold vias (S16) and forming conductive bumps (S17). Various steps of FIG. 3 will now be described in detail with reference to FIGS. 4A to 4C.

The steps S11, S12, S13, S14 and S15 are the same with the steps S1, S2, S3, S4 and S5 of FIG. 1, and figures illustrating the respective steps S11, S12, S13, S14 and S15 are the same with FIGS. 2A to 2H, and detailed descriptions thereof will not be given.

In the forming of the through mold vias (S16), through mold vias (TMVs) 280 are formed in the encapsulant 150. As illustrated in FIG. 4A, in the forming of the through mold vias (TMVs) (S16), the TMVs 280 passing through a region ranging from a top surface of the encapsulant 150 to the top surface of thee interposer 110. The TMVs 280 are formed between the semiconductor die 130 and the reinforcement member 120. In detail, the TMVs 280 are formed by forming through holes passing through the encapsulant 150 by, for example, a laser drilling process, plating a thermally conductive metal having high electric and thermal conductivity, such as aluminum (Al) or copper (Cu), on inner wall surfaces of the through holes, and then filling the through holes with a conductive material, such as a metal paste. Accordingly, the semiconductor package according to the present disclosure can easily emit heat generated from the interposer 110 through the TMVs 280. Additionally, a semiconductor die or a semiconductor package may further be electrically stacked on the TMVs 280.

In the forming of the conductive bumps (S17), the wafer 10 positioned under the interposer 110 is removed and the conductive bumps 160 are formed under the interposer 110. First, as illustrated in FIG. 4B, in the forming of the conductive bumps (S17), the wafer 10 positioned under the interposer 110 is removed. For example, the wafer 10 may be removed by a general grinding process. Accordingly, the redistribution layer 111 (e.g., a first redistribution layer or conductive layer) is exposed to a bottom surface of the interposer 110. Next, as illustrated in FIG. 4C, in the forming of the conductive bumps (S17), the conductive bumps 160 are formed on the redistribution layer 111 exposed to the bottom surface of the interposer 110. Here, under bump metals (UBMs) may be formed on the redistribution layer 111 exposed to the bottom surface of the interposer 110 and the conductive bumps 160 may be formed on the UBMs. The UBMs may improve board-level reliability of the conductive bumps 160 by preventing inter-metal compounds from being formed between the conductive bumps 160 and the redistribution layer 111.

The conductive bumps 160 may be made of a material selected from, but not limited to, eutectic solders (e.g., Sn37Pb), high-lead solders (e.g., Sn95Pb) having a high melting point, lead-free solders (e.g., SnAg, SnCu, SnZn, SnZnBi, SnAgCu and SnAgBi) and equivalents thereof.

Next, although not shown, a sawing process is performed to form a single unit consisting of at least one semiconductor die 130 and the reinforcement member 120 corresponding thereto disposed in the receiving space S (or die space or component space), thereby fabricating the semiconductor package 200 according to another embodiment of the present disclosure. Here, the sawing process may be performed using sawing equipment (for example, a diamond blade or laser beams).

Figure 5:
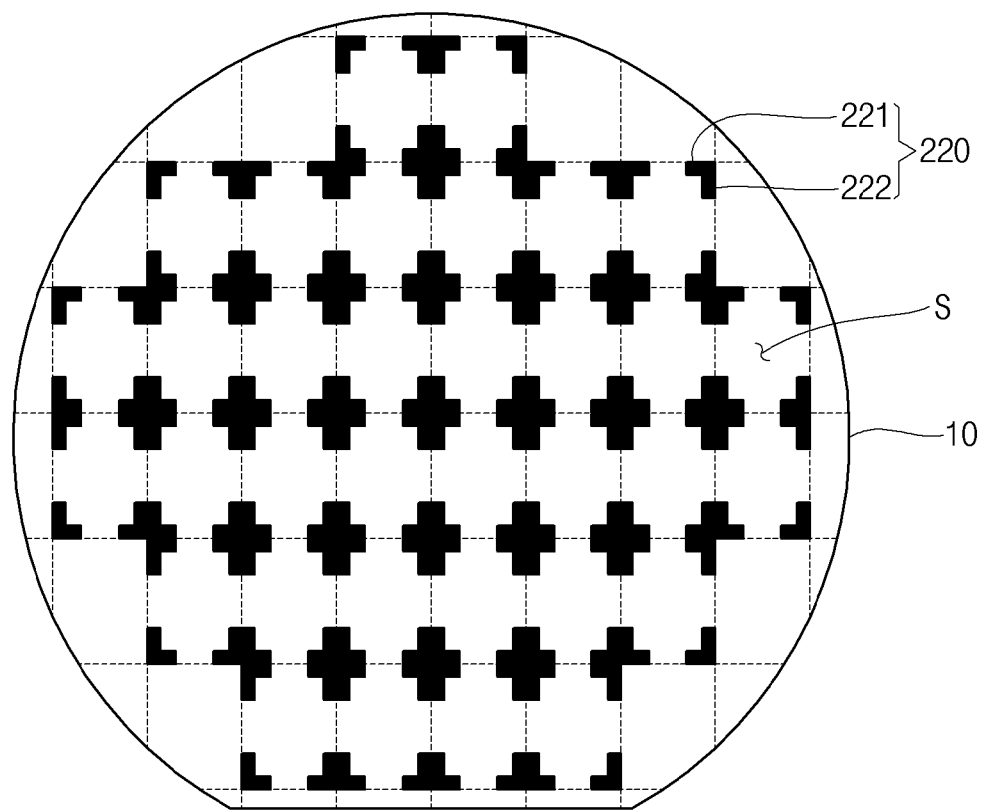
FIG. 5 is a plan view illustrating another embodiment of a step of forming a reinforcement member in a method for fabricating a semiconductor package according to the present disclosure.

FIG. 5 is a plan view illustrating another embodiment of a step of forming a reinforcement member in a method for fabricating a semiconductor package according to the present disclosure.

Referring to FIG. 5, in the forming of the reinforcement member, a reinforcement member 220 is formed on the wafer 10. The reinforcement member 220 is formed at corners of sawing lines for sawing the wafer 10 to form a discrete semiconductor package. Therefore, the reinforcement member 220 may include four members spaced apart from one another. The reinforcement member 220 may be formed in a substantially 'L' shaped configuration and includes a first reinforcement member part 221 and a second reinforcement member part 222 perpendicular to the first reinforcement member part 221. Here, the first reinforcement member part 221 is formed to be perpendicular to one line of the sawing lines. In addition, the respective members of the reinforcement member 220 are formed to be spaced apart from one another to form receiving spaces (or die spaces or component spaces) in which semiconductor dies are to be mounted. After sawing the wafer 10, the reinforcement member 220 supports the top surface of the interposer at each corner of the single semiconductor package, thereby preventing twisting or warpage from occurring during a semiconductor fabricating process.

Figure 6:
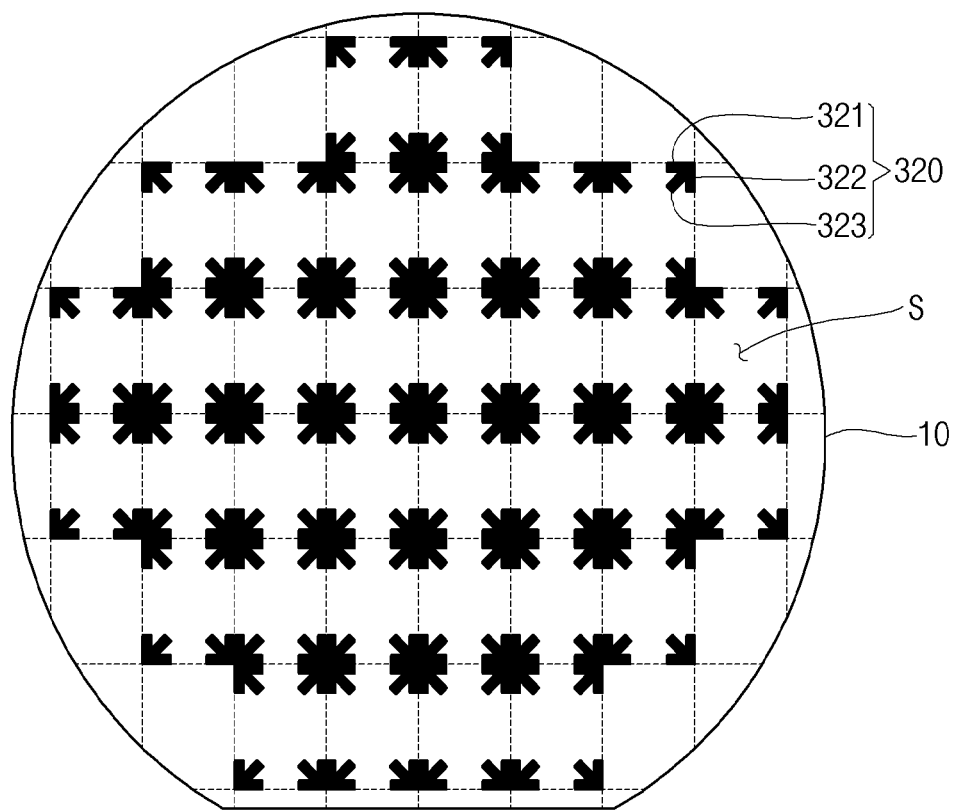
FIG. 6 is a plan view illustrating still another embodiment of a step of forming a reinforcement member in a method for fabricating a semiconductor package according to the present disclosure.

FIG. 6 is a plan view illustrating still another embodiment of a step of forming a reinforcement member in a method for fabricating a semiconductor package according to the present disclosure.

Referring to FIG. 6, in the forming of the reinforcement member, a reinforcement member 320 is formed on the wafer 10. The reinforcement member 320 is formed at each corner of the sawing lines for forming a single semiconductor package by sawing the wafer 10. Therefore, the reinforcement member 320 may include four members spaced apart from one another. The reinforcement member 320 may be formed in a substantially arrow-shaped configuration and includes a first reinforcement member part 321, a second reinforcement member part 322 perpendicular to the first reinforcement member part 321, and a third reinforcement member part 323 positioned between the first reinforcement member part 321 and the second reinforcement member part 322. Here, the first reinforcement member part 321 is formed to be perpendicular to one line of the sawing lines. In addition, the respective members of the reinforcement member 320 are formed to be spaced apart from one another to form receiving spaces S (or die spaces or component spaces) in which semiconductor dies are to be mounted. After sawing the wafer 10, the reinforcement member 320 supports the top surface of the interposer at each corner of the single semiconductor package, thereby preventing twisting or warpage from occurring during a semiconductor fabricating process.

While the method for fabricating a semiconductor package and the semiconductor package using the same according to various aspects of the present disclosure have been described with reference to certain supporting embodiments, it will be understood by those skilled in the art that the present disclosure not be limited to the particular embodiments disclosed, but that the present disclosure will include all embodiments falling within the scope of the appended claims The discussion herein included numerous illustrative figures that showed various portions of an electronic device and method of manufacturing thereof. For illustrative clarity, such figures did not show all aspects of each example assembly. Any of the example assemblies and/or methods provided herein may share any or all characteristics with any or all other assemblies and/or methods provided herein.

In summary, various aspects of this disclosure provide a semiconductor package and a manufacturing method thereof, which can reduce the size of the semiconductor package and can improve product reliability. In a non-limiting example embodiment, the method may comprise forming an interposer on a wafer, forming at least one reinforcement member on the interposer, coupling and electrically connecting at least one semiconductor die to the interposer to the interposer, filling a region between the semiconductor die and the interposer with an underfill, and encapsulating the reinforcement member, the semiconductor die and the underfill on the interposer using an encapsulant. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method for fabricating a semiconductor package, the method comprising:
   forming a substrate on a wafer;
   forming at least one reinforcement member on a portion of a perimeter of the substrate, wherein the at least one reinforcement member comprises a conductive material;
   coupling and electrically connecting at least one semiconductor die to the substrate; and
   encapsulating the at least one reinforcement member and the semiconductor die on the substrate with an encapsulant.

2. The method according to claim 1, wherein forming the at least one reinforcement member comprises forming a plurality of discrete reinforcement members.

3. The method according to claim 1, wherein forming the at least one reinforcement member comprises forming a closed perimeter wall along the perimeter of the substrate.

4. The method according to claim 1, comprising underfilling a space between the semiconductor die and the substrate.

5. The method according to claim 4, wherein the underfilling comprises underfilling prior to the encapsulating.

6. The method according to claim 5, wherein the underfilling results in an underfill that extends to the at least one reinforcement member.

7. The method according to claim 5, wherein the underfilling results in an underfill that does not extend to the at least one reinforcement member.

8. The method according to claim 1, comprising, after said encapsulating:
   removing the wafer from the substrate and forming conductive bumps on a surface of the substrate that was covered by the wafer; and
   sawing the substrate to form a discrete semiconductor package.

9. The method according to claim 1, comprising forming a shielding layer that surrounds the encapsulant and is electrically connected to the at least one reinforcement member.

10. The method according to claim 1, comprising forming through mold vias (TMVs) from a top surface of the encapsulant to the top surface of the substrate.

11. A semiconductor package comprising:
a substrate;
at least one reinforcement member on the substrate, wherein each of the at least one reinforcement member comprises a conductive material;
at least one semiconductor die coupled to the substrate and electrically connected to a first surface of the substrate; and
an encapsulant encapsulating the at least one reinforcement member and the at least one semiconductor die on the substrate.

12. The semiconductor package according to claim 11, wherein the at least one reinforcement member comprises a plurality of discrete reinforcement members.

13. The semiconductor package according to claim 11, wherein the at least one reinforcement member comprises a closed perimeter wall along a perimeter of the substrate.

14. The semiconductor package according to claim 11, wherein, under the encapsulant, there is an underfill, between the semiconductor die and the substrate, that contacts a vertical surface of the at least one reinforcement member.

15. The semiconductor package according to claim 11, wherein, under the encapsulant, there is an underfill, between the semiconductor die and the substrate, that does not contact any of the at least one reinforcement member.

16. The semiconductor package according to claim 11, wherein the substrate is a printed circuit board.

17. The semiconductor package according to claim 11, comprising conductive bumps, on a second surface of the substrate opposite the first surface, electrically connected to the substrate.

18. The semiconductor package according to claim 11, comprising a shielding layer that surrounds the encapsulant and is electrically connected to the at least one reinforcement member.

19. The semiconductor package according to claim 11, comprising through mold vias (TMVs) passing through a region ranging from a top surface of the encapsulant to the top surface of the substrate, wherein each of the TMVs are positioned between the semiconductor die and one of the at least one reinforcement member.

20. A semiconductor package comprising:
a substrate on a wafer;
at least one reinforcement member on the substrate, wherein the at least one reinforcement member comprises a conductive material;
at least one semiconductor die coupled and electrically connected to the substrate; and
an encapsulant that covers the at least one reinforcement member and the at least one semiconductor die,
wherein:
the substrate comprises vertical surfaces at ends of the substrate,
each of the at least one reinforcement member has an internal vertical surface that faces the at least one semiconductor die and an external vertical surface opposite the internal vertical surface,
the encapsulant has vertical surfaces at ends of the encapsulant, and
the external vertical surface of the each of the at least one reinforcement member, a corresponding one of the vertical surfaces of the substrate, and a corresponding one of the vertical surfaces of the encapsulant are substantially coplanar with each other.

* * * * *